(12) United States Patent
Hansen et al.

(10) Patent No.: US 10,147,875 B1
(45) Date of Patent: Dec. 4, 2018

(54) SEMICONDUCTOR DEVICES AND ELECTRONIC SYSTEMS HAVING MEMORY STRUCTURES

(71) Applicant: Micron Technology, Inc., Boise, ID (US)

(72) Inventors: Andrew J. Hansen, Boise, ID (US); James A. Cultra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/692,599

(22) Filed: Aug. 31, 2017

(51) Int. Cl.
*H01L 45/00* (2006.01)
*H01L 27/22* (2006.01)
*H01L 27/24* (2006.01)
*H01L 43/02* (2006.01)
*H01L 43/08* (2006.01)
*H01L 43/12* (2006.01)

(52) U.S. Cl.
CPC ............ *H01L 45/12* (2013.01); *H01L 27/224* (2013.01); *H01L 27/2409* (2013.01); *H01L 27/2463* (2013.01); *H01L 43/02* (2013.01); *H01L 43/08* (2013.01); *H01L 43/12* (2013.01); *H01L 45/065* (2013.01); *H01L 45/085* (2013.01); *H01L 45/1233* (2013.01); *H01L 45/1253* (2013.01); *H01L 45/16* (2013.01)

(58) Field of Classification Search
CPC ..... H01L 45/12; H01L 45/065; H01L 45/085; H01L 45/1233; H01L 45/1253; H01L 45/16; H01L 27/224; H01L 27/2409; H01L 27/2463; H01L 43/02; H01L 43/08; H01L 43/12

See application file for complete search history.

(56) References Cited

U.S. PATENT DOCUMENTS

| 7,674,698 | B2 * | 3/2010 | Forbes | H01L 21/28079 257/369 |
|---|---|---|---|---|
| 8,053,302 | B2 * | 11/2011 | Seol | H01L 27/11582 257/320 |
| 9,281,471 | B2 | 3/2016 | Hu et al. | |
| 9,305,933 | B2 * | 4/2016 | Lee | H01L 27/1157 |
| 9,397,143 | B2 | 7/2016 | Rocklein et al. | |
| 9,484,357 | B2 * | 11/2016 | Makala | H01L 27/1157 |
| 9,484,358 | B2 * | 11/2016 | Alsmeier | H01L 27/11551 |
| 9,524,984 | B1 * | 12/2016 | Lee | H01L 27/1157 |
| 9,666,525 | B2 * | 5/2017 | Kim | H01L 23/5226 |
| 9,748,266 | B1 * | 8/2017 | Baraskar | H01L 27/11582 |
| 9,748,267 | B2 * | 8/2017 | Zhang | H01L 27/11529 |
| 9,876,027 | B2 * | 1/2018 | Yada | H01L 21/02164 |
| 9,985,098 | B2 * | 5/2018 | Matsumoto | H01L 27/11524 |
| 2015/0060992 | A1 * | 3/2015 | Taekyung | H01L 29/7926 257/324 |
| 2015/0287916 | A1 | 10/2015 | Campbell et al. | |
| 2015/0318038 | A1 | 11/2015 | Hu et al. | |

(Continued)

*Primary Examiner* — Ida M Soward
(74) *Attorney, Agent, or Firm* — TraskBritt (57) ABSTRACT

A semiconductor device comprises includes memory cells, a first dielectric liner material overlying side surfaces of the memory cells, a high-k dielectric material overlying side surfaces of the first dielectric liner material, a second dielectric liner material overlying side surfaces of the high-k dielectric material, and an additional dielectric material overlying side surfaces of the second dielectric liner material. A memory structure, an electronic system, and a method of forming a memory structure are also described.

13 Claims, 4 Drawing Sheets

(56) References Cited

U.S. PATENT DOCUMENTS

| | | | |
|---|---|---|---|
| 2016/0071861 A1* | 3/2016 | Serov | H01L 27/11556 365/185.19 |
| 2016/0104719 A1* | 4/2016 | Jung | H01L 27/11582 257/324 |
| 2016/0118391 A1* | 4/2016 | Zhao | H01L 27/11582 257/66 |
| 2016/0358933 A1* | 12/2016 | Rabkin | H01L 27/11582 |
| 2017/0062456 A1* | 3/2017 | Sugino | H01L 27/11582 |
| 2017/0117289 A1* | 4/2017 | Liu | H01L 27/1157 |

* cited by examiner

SEMICONDUCTOR DEVICES AND ELECTRONIC SYSTEMS HAVING MEMORY STRUCTURES

FIELD

Embodiments of the disclosure relate to the field of semiconductor device design and fabrication. More specifically, embodiments of the disclosure relate to memory structures including dielectric liner materials overlying memory cells, to methods of forming the memory structures, and to related semiconductor devices and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read only memory (ROM), dynamic random access memory (DRAM), synchronous dynamic random access memory (SDRAM), flash memory, and resistance variable memory. Non-limiting examples of resistance variable memory include resistive random access memory (RRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

Some memory devices include memory arrays exhibiting memory cells arranged in a cross-point architecture including conductive lines (e.g., access lines, such as word lines) extending perpendicular (e.g., orthogonal) to additional conductive lines (e.g., data lines, such as bit lines). The memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. Select devices can be used to select particular memory cells of a memory array.

Challenges related to memory device fabrication include decreasing the size of a memory device, increasing the storage density of a memory device, and reducing fabrication costs. For example, fabricating 3D cross-point memory arrays often requires forming high aspect ratio memory cells from stacks of materials. Frequently, materials that are sensitive to downstream processing conditions are present in the stacks. For example, 3D cross-point memory cells may include materials, such as chalcogenide materials, carbon-containing materials, and other sensitive materials, that may be damaged at the temperatures used during conventional semiconductor fabrication processes and/or that may undesirably react with various materials (e.g., etchants, oxidizers) used during downstream processing. For instance, chalcogenide materials in the stacks may volatilize during conventional deposition techniques, causing delamination of the stack materials. To protect the stacks, liner materials have been formed over the materials of the stack before subsequent processing acts are conducted. Unfortunately, conventional liner materials and conventional liner material systems can damage the materials of the stack during formation, can suffer from one or more of poor adhesion to the different materials of the stack, can adversely interact the additional materials formed thereover during subsequent processing acts, and/or can hinder the efficacy of subsequent processing acts (e.g., subsequent material removal processes, such as subsequent chemical-mechanical planarization acts).

A need, therefore, exists for new memory structures, such as cross-point memory structures, including liner materials overlying memory cells, as well as for semiconductor devices (e.g., memory devices) and electronic systems including the memory structures, and methods of forming the memory structures that overcome one or more (e.g., all) of the aforementioned problems of conventional memory structures, conventional semiconductor devices, conventional electronic systems, and conventional methods of forming memory structures.

DETAILED DESCRIPTION

Memory structures including dielectric liner materials overlying memory cells are disclosed, as are related semiconductor devices (e.g., memory devices), electronic systems, and methods of forming memory structures. In some embodiments, a memory structure includes memory cells on or over one or more conductive line structures, a first dielectric liner material (e.g., a first dielectric nitride material) on or over surfaces of the memory cells, a high-k dielectric material on or over surfaces of the first dielectric liner material, a second dielectric liner material (e.g., a second dielectric nitride material) on or over surfaces of the high-k dielectric material, and an additional dielectric material on or over surfaces of the second dielectric liner material. The second dielectric liner material may enhance the protection of the memory cells relative to the first dielectric liner material and the high-k dielectric material alone, and may prevent adverse interactions between the high-k dielectric material and one or more other materials (e.g., one or more precursor materials) during the formation of the additional dielectric material to ensure that the high-k dielectric material and the additional dielectric material exhibit desirable and predetermined properties. In addition, an oxide material (e.g., a dielectric oxide material) may, optionally, be located between the second dielectric liner material and the additional dielectric material. If present, the oxide material may enhance adhesion between the second dielectric liner material and the additional dielectric material. The memory structures and methods of the disclosure may facilitate the formation of semiconductor devices and electronic systems exhibiting increased reliability, performance, and durability relative to conventional semiconductor devices and conventional electronic systems.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device (e.g., a memory device). The semiconductor device structures (e.g., memory structures) described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques. Also note, any drawings presented herein are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or may be undoped.

As used herein, the term "configured" refers to a size, shape, material composition, and arrangement of one or more of at least one structure and at least one apparatus facilitating operation of one or more of the structure and the apparatus in a pre-determined way.

As used herein, the singular forms "a," "an," and "the" are intended to include the plural forms as well, unless the context clearly indicates otherwise.

As used herein, the term "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

Figure 1A:
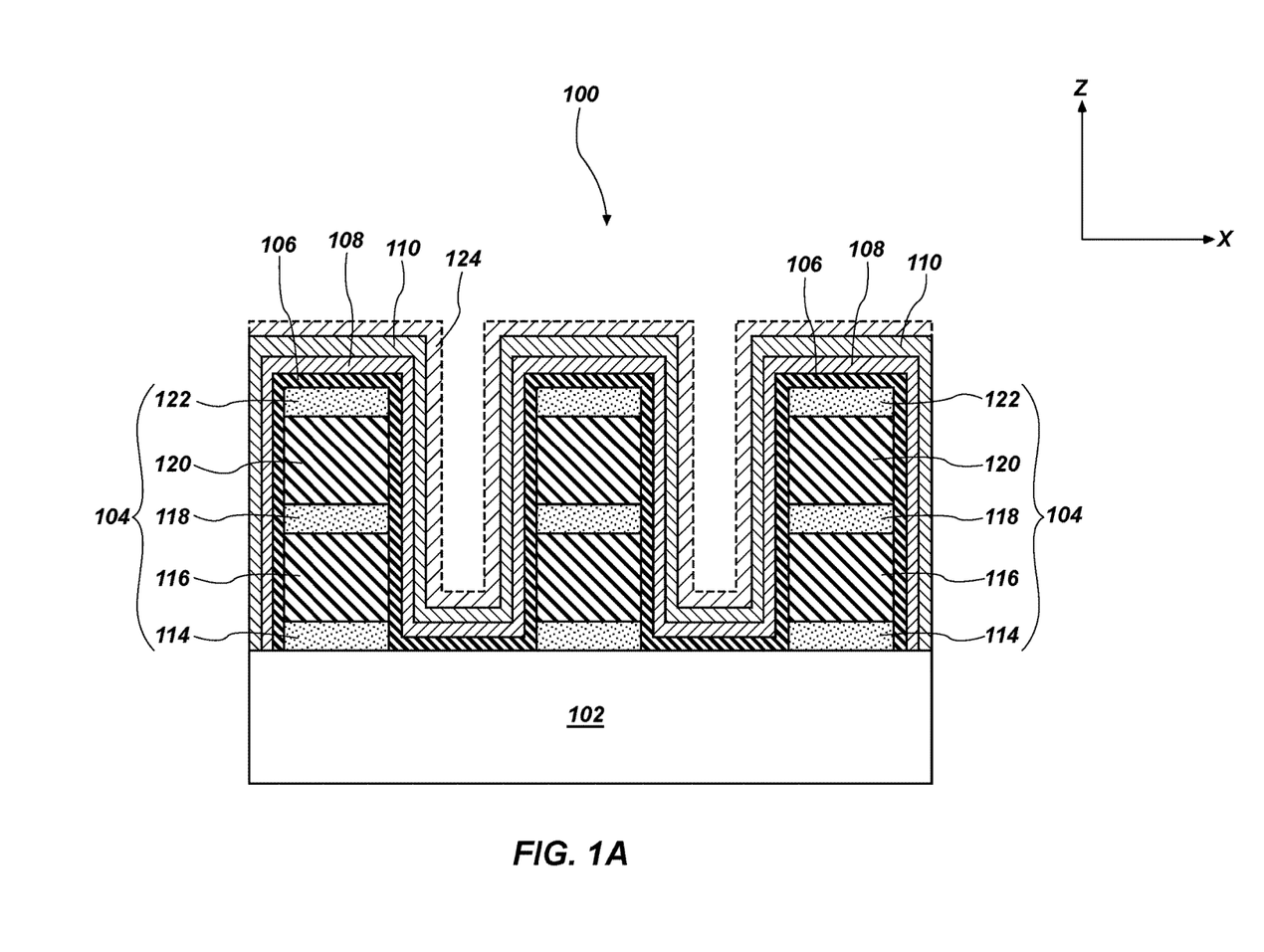
FIGS. 1A through 1C are simplified cross-sectional views illustrating a method of forming a memory structure of a semiconductor device, in accordance with embodiments of the disclosure.
Figure 1B:
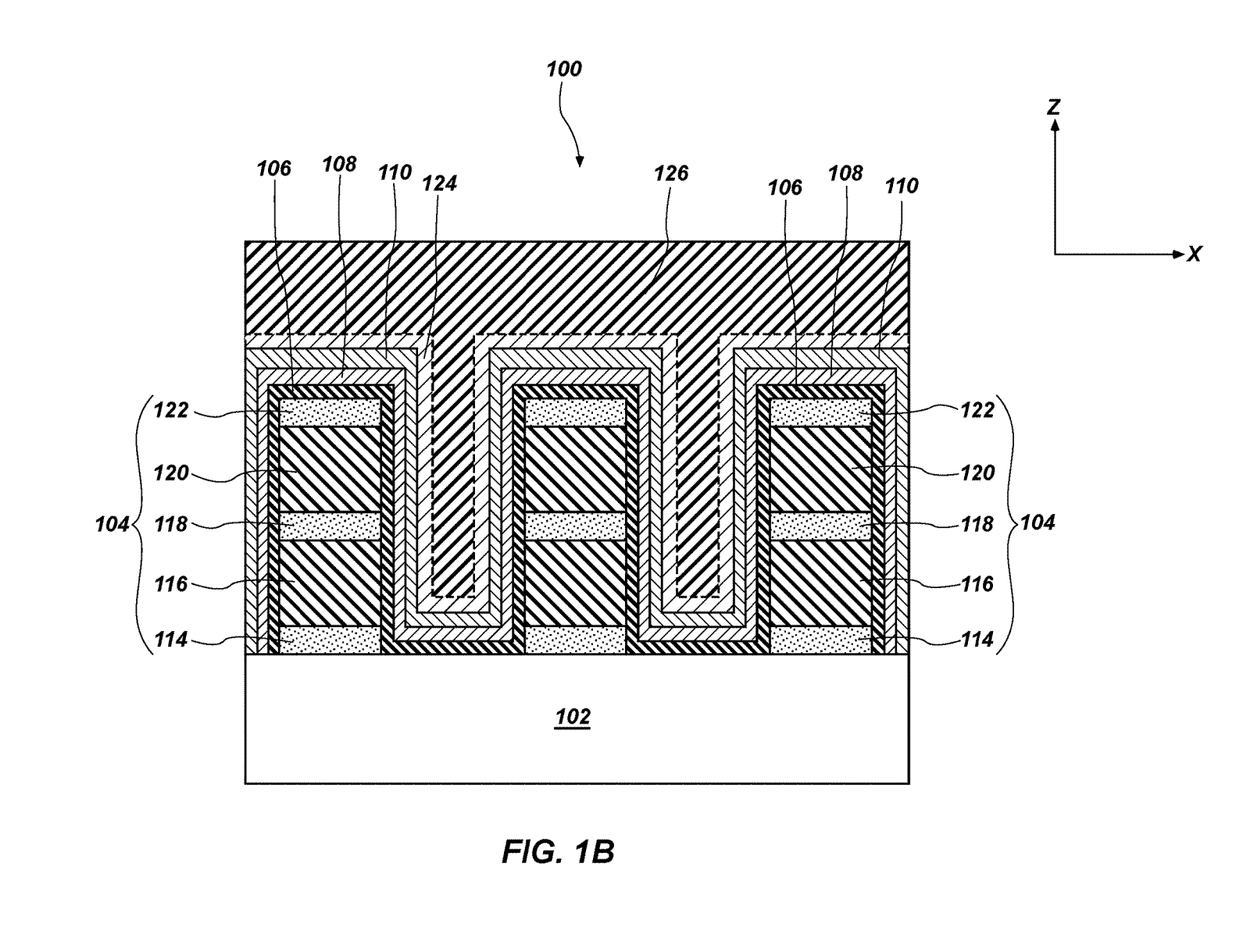
Figure 1C:
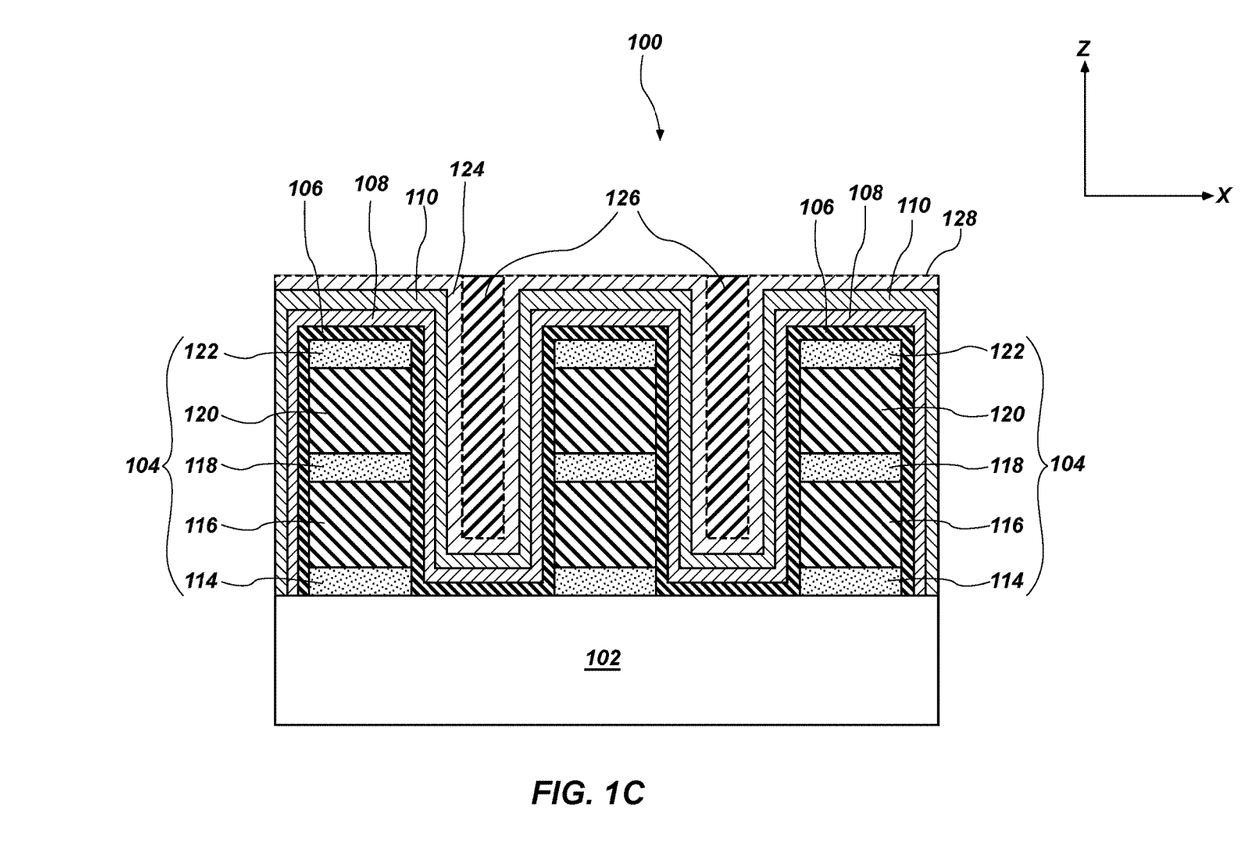

FIGS. 1A through 1C are simplified perspective views illustrating embodiments of a method of forming a memory structure, such as a 3D cross-point memory structure of a semiconductor device (e.g., a memory device, such as a RRAM device, a conductive bridge RAM device, an MRAM device, a PCM memory device, a PCRAM device, an STTRAM device, an oxygen vacancy-based memory device, and/or a programmable conductor memory device). With the description provided below, it will be readily apparent to one of ordinary skill in the art that the methods described herein may be used in various devices. In other words, the methods of the disclosure may be used whenever it is desired to form a semiconductor device structure.

Referring to FIG. 1A, in accordance with an embodiment of the disclosure, a memory structure 100 may be formed to include at least one conductive line structure 102, memory cells 104, a first dielectric liner material 106, a high-k dielectric material 108, a second dielectric liner material 110, and, optionally, an oxide material 124. The memory cells 104 may be located on or over the at least one conductive line structure 102, the first dielectric liner material 106 may be located on or over the memory cells 104, the high-k dielectric material 108 may be located on or over the first dielectric liner material 106, the second dielectric liner material 110 may be located on or over the high-k dielectric material 108, and the oxide material 124 (if present) may be located on or over the second dielectric liner material 110.

The conductive line structure 102 (e.g., access line structure) may be formed of and include at least one conductive material, such as a metal, a metal alloy, a conductive metal oxide, a conductive metal nitride, a conductive metal silicide, a conductively doped semiconductor material, or combinations thereof. By way of non-limiting example, the conductive line structure 102 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide (IrO$_x$), ruthenium (Ru), ruthenium oxide (RuO$_x$), and conductively doped silicon. In some embodiments, the conductive line structure 102 is formed of and includes W. The conductive line structure 102 may be positioned in, on, or over a substrate.

The conductive line structure 102 may be formed using conventional processes (e.g., conventional deposition processes, conventional material removal processes) and conventional processing equipment, which are not described in detail herein. By way of non-limiting example, a conductive material may be formed (e.g., through at least one of in situ growth, spin-on coating, blanket coating, chemical vapor deposition (CVD), plasma enhanced chemical vapor deposition (PECVD), atomic layer deposition (ALD), and physical vapor deposition (PVD)) and patterned (e.g., through at least one material removal process, such as at least one of a wet etching process and a dry etching process) to form the conductive line structure 102.

Each of the memory cells 104 may individually include a first electrode structure 114 on or over the conductive line structure 102, a select device structure 116 on or over the first electrode structure 114, an optional second electrode structure 118 on or over the select device structure 116, a storage element structure 120 on or over the select device structure 116 (e.g., on or over the optional second electrode structure 118), and a third electrode structure 122 on or over the storage element structure 120. In additional embodiments, the relative positions of the select device structure 116 and the storage element structure 120 may be switched. For example, the storage element structure 120 may be located on or over the first electrode structure 114, and the select device structure 116 may be located on or over the storage element structure 120 (e.g., on or over the optional second electrode structure 118). In further embodiments wherein the second electrode structure 118 is omitted (e.g., absent), the select device structure 116 and the storage element structure 120 may comprise a single (e.g., only one) structure (e.g., a single resistance variable structure) able to perform the functions of the both the select device structure 116 and the storage element structure 120 (as described in further detail below).

The first electrode structure 114, the second electrode structure 118 (if present), and the third electrode structure 122 may serve as electrode contacts, and may each individually be formed of and include a conductive material, such as one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, conductively doped silicon, and a carbon material. The first electrode structure 114, the second electrode structure 118 (if present), and the third electrode structure 122 may each be formed of and include substantially the same conductive material, or one or more of the first electrode structure 114, the second electrode structure 118 (if present), and the third electrode structure 122 may be formed of and include a different conductive material than one or more other of the first electrode structure 114, the second electrode structure 118 (if present), and the third electrode structure 122. In some embodiments, the first electrode structure 114, the second electrode structure 118 (if present), and the third electrode structure 122 are each formed of and include a carbon material. As used herein, the term "carbon material" means and includes material including carbon atoms. The carbon material may be substantially free of atoms other than carbon atoms, or may include carbon atoms and atoms of at least one additional element. By way of non-limiting example, one or more (e.g., each) of the first electrode structure 114, the second electrode structure 118 (if present), and the third electrode structure 122 may be formed of and include a non-stoichiometric compound including carbon (C) atoms and nitrogen (N) atoms. As used herein, the term "non-stoichiometric compound" means and includes a chemical compound with an elemental composition that cannot be represented by a ratio of well-defined natural numbers and is in violation of the law of definite and multiple proportions. One or more (e.g., each) of the first electrode structure 114, the second electrode structure 118 (if present), and the third electrode structure 122 may, for example, include from about 80 atomic percent carbon to about 99.9 atomic percent carbon and from about 0.10 atomic percent nitrogen to about 20 atomic percent nitrogen.

The select device structure 116 (e.g., access device structure) may be formed of and include at least one material configured and formulated relative to the material composition(s) of the other components (e.g., the conductive line structure 102, the first electrode structure 114, the second electrode structure 118 (if present)) of the memory structure 100 to form a switch for the storage element structure 120. The select device structure 116 may be formed of and include one or more of at least one chalcogenide material, at least one semiconductor material, and at least one insulative material, which together with the other components of the memory structure 100 (e.g., the first electrode structure 114 and the second electrode structure 118) form a non-ohmic device (NOD) stack. The NOD stack may, for example, exhibit an ovonic threshold switch (OTS) configuration, a conductor-semiconductor-conductor (CSC) switch configuration, a metal-insulator-metal (MIM) switch configuration, a metal-semiconductor-metal (MSM) switch configuration, a metal-insulator-insulator-metal (MIIM) switch configuration, a metal-semiconductor-semiconductor-metal (MSSM) switch configuration, a metal-insulator-semiconductor-metal (MISM) switch configuration, a metal-semiconductor-insulator-metal (MSIM) switch configuration, a metal-insulator-semiconductor-insulator-metal (MISIM) switch configuration, a metal-semiconductor-insulator-semiconductor-metal (MSISM) switch configuration, a metal-insulator-insulator-insulator-metal (MIIIM) switch configuration, a metal-semiconductor-semiconductor-semiconductor-metal (MSSSM) switch configuration, or another type of two-terminal select device configuration.

In some embodiments, the select device structure 116 is formed of and includes a chalcogenide compound. As used herein, the term "chalcogenide compound" refers to a binary or multinary compound that includes at least one chalcogen atom and a more electropositive element or radical. As used herein, the term "chalcogen" refers to an element of Group VI of the Periodic Table, such as oxygen (O), sulfur (S), selenium (Se), or tellurium (Te). The electropositive element may include, but is not limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. The chalcogenide compound may be a binary, ternary, or quaternary alloy. Non-limiting examples of suitable chalcogenide compounds for the select device structure 116 include As and Te compounds, such as $As_2Te_3$; As and Se compounds, such as $As_2Se_3$; As, Te, and Ge compounds, such as $As_{30}Te_{45}Ge_{25}$; As, Se, and Ge compounds, such as $As_{28}Se_{42}Ge_{30}$; As, S, Se, and Ge compounds, such as $As_{30}S_{12}Se_{33}Ge_{25}$; and As, Te, Ge, Si, In compounds, such as $As_{37}Te_{39}Ge_9Si_{14}In$.

The storage element structure 120, which may also be characterized as a programmable structure, may be formed of and include at least one resistance variable material. As used herein, the term "resistance variable material" means and includes a material formulated to be switched from one resistance state to another resistance state upon application of at least one physical signal (e.g., at least one of heat, voltage, current, or other physical phenomena) thereto. Embodiments of the disclosure are not limited to a particular resistance variable material. The storage element structure 120 may, for example, be formed of and include a resistance variable material configured and formulated for one or more of RRAM, conductive bridge RAM, MRAM, PCM memory, PCRAM, STTRAM, oxygen vacancy-based memory, and programmable conductor memory. Suitable resistance variable materials include, but are not limited to, active switching materials (e.g., solid state electrolyte materials, such as transition metal oxide (TMO) materials, chalcogenide materials, dielectric metal oxide materials, mixed valence oxides including two or more metals and/or metalloids), metal ion source materials, oxygen-gettering materials, phase change materials, binary metal oxide materials, colossal magnetoresistive materials, and polymer-based resistance variable materials.

In some embodiments, the storage element structure 120 is formed of and includes a chalcogenide compound. The chalcogen may comprise one or more of O, S, Se, and Te. The electropositive element may include, but is not limited to, N, Si, Ni, Ga, Ge, As, Ag, In, Cd, Zn, Sn, Sb, Au, Pb, Bi, or combinations thereof. The chalcogenide compound may be a binary, ternary, or quaternary alloy. Non-limiting examples of suitable chalcogenide compounds for the storage element structure 120 include Sb and Te compounds, such as $Sb_2Te_3$; Ge and Te compounds, such as GeTe; In and Se compounds, such as $In_2Se_3$; Sn and Te compounds, such as SnTe; Bi and Te compounds, such as $Bi_2Te_3$; Sb and Te compounds, such as SbTe, or $Sb_2Te_3$; Sn and Se compounds, such as SnSe; Ge and Se compounds, such as GeSe; Ga, Se, and Te compounds, such as GaSeTe; Ge, Sb, and Te compounds, such as $Ge_2Sb_2Te_5$; Sn, Sb, and Te compounds, such as $SnSb_2Te_4$; Au, Ge, Sn, and Te compounds, such as $Au_{25}Ge_4Sn_{11}Te_{60}$; Au, In, Sb, and Te compounds, such as AuInSbTe; Ag and Se compounds, such as $Ag_2Se$; In and Te compounds, such as InTe; and In, Sb, and Te (IST) compounds, such as InSbTe.

The select device structure 116 and the storage element structure 120 may be formed of and include substantially the same material (e.g., substantially the same chalcogenide compound), or may be formed of and include different materials (e.g., different chalcogenide compounds). In some embodiments, the select device structure 116 and the storage element structure 120 are formed of and include different chalcogenide compounds than one another. In further embodiments, the select device structure 116 and the storage element structure 120 are formed of and include substantially the same chalcogenide compounds as one another. In embodiments wherein the second electrode structure 118 is omitted, the select device structure 116 and the storage element structure 120 may comprise a single (e.g., only one) structure (e.g., a single self-selecting storage element structure) formed of and including a single material (e.g., a single chalcogenide compound), or may comprise a single (e.g., only one) structure formed of and including multiple (e.g., more than one) materials (e.g., multiple chalcogenide compounds).

The memory structure 100 may include rows of the memory cells 104 extending in a first lateral direction (e.g., an X-direction) and columns of the memory cells 104 extending in a second lateral direction (e.g., a Y-direction) substantially perpendicular to the first lateral direction. The memory cells 104 within each row may be substantially aligned with one another, and the memory cells 104 within each column may also be substantially aligned with one another. For example, adjacent (i.e., neighboring) memory cells 104 most proximate one another in the first lateral direction (e.g., the X-direction) may be substantially aligned with one another in the second lateral direction (e.g., the Y-direction), and other adjacent memory cells 104 most proximate one another in the second lateral direction (e.g., the Y-direction) may be substantially aligned with one another in the first lateral direction (e.g., the X-direction). In additional embodiments, at least some adjacent memory cells 104 most proximate one another in the first lateral direction may be unaligned with (e.g., offset from) one another in the second lateral direction, and/or at least some adjacent memory cells 104 most proximate one another in the second lateral direction may be unaligned with (e.g., offset from) one another in the first lateral direction.

The memory cells 104 may each individually exhibit any desired dimensions (e.g., length, width, diameter, height) and any desired shape. Each of the memory cells 104 may individually exhibit an aspect ratio (e.g., ratio of height to width or diameter) within a range of from about 1:1 to about 100:1, such as from about 5:1 to about 50:1, from about 10:1 to about 30:1; or from about 15:1 to about 25:1. In addition, in some embodiments, the memory cells 104 each individually exhibit a cylindrical column shape including a substantially circular lateral cross-sectional geometry. In additional embodiments, one or more of the memory cells 104 may exhibit a different shape, such as a rectangular column shape, a tube shape, a fin shape, a pillar shape, a stud shape, dome shape, a cone shape, a frusto cone shape, a pyramid shape, a frusto pyramid shape, or an irregular shape. Each of the memory cells 104 may exhibit substantially the same dimensions and substantially the same shape as each other of the memory cells 104, or one or more of the memory cells 104 may exhibit at least one different dimension and/or a different shape than one or more other of the memory cells 104. In some embodiments, each of the memory cells 104 exhibits substantially the same dimensions and substantially the same shape as each other of the memory cells 104.

The memory cells 104 may exhibit any desired spacing relative to one another. Adjacent memory cells 104 within each row of the memory cells 104 may be substantially uniformly (e.g., substantially regularly) spaced apart from one another by a first distance, and adjacent memory cells 104 within each column of the memory cells 104 may be substantially uniformly (e.g., substantially regularly) spaced apart from one another by a second distance. The first distance may be substantially the same as the second distance, or the first distance may be different than the second distance. Accordingly, a pitch between centers of adjacent memory cells 104 within each of the rows may be substantially constant (e.g., non-variable), and a pitch between centers of adjacent memory cells 104 within each of the columns may also be substantially constant (e.g., non-variable). In additional embodiments, at least some adjacent memory cells 104 within at least one row of the memory cells 104 are spaced apart from one another by a different distance than at least some other adjacent memory cells 104 within the row, and/or at least some adjacent memory cells 104 within at least one column of the memory cells 104 are spaced apart from one another by a different distance than at least some other adjacent memory cells 104 within the column. Accordingly, a pitch between centers of at least some adjacent memory cells 104 within at least one row may be different than a pitch between centers of at least some other adjacent memory cells 104 within the row, and/or a pitch between centers of at least some adjacent memory cells 104 within at least one column may be different than a pitch between centers of at least some other adjacent memory cells 104 within the column.

The memory cells 104, including the various components thereof (e.g., the first electrode structure 114, the select device structure 116, the second electrode structure 118 (if any), the storage element structure 120, the third electrode structure 122) may be formed using conventional processes (e.g., conventional deposition processes, conventional photolithography processes, conventional material removal processes) and conventional processing equipment, which are not described in detail herein. By way of non-limiting example, materials of the different components of the memory cells 104 may be formed (e.g., through one or more of in situ growth, spin-on coating, blanket coating, CVD, PECVD, ALD, and PVD) and patterned (e.g., through at least one material removal process, such as at least one of a wet etching process and a dry etching process) to form the memory cells 104.

With continued reference to FIG. 1A, the first dielectric liner material 106 may at least partially (e.g., substantially, completely) cover (e.g., surround, envelop) the memory cells 104. The first dielectric liner material 106 adheres directly to the components (e.g., the first electrode structure 114, the select device structure 116, the second electrode structure 118 (if any), the storage element structure 120, the third electrode structure 122) of the memory cells 104, and may protect the memory cells 104 from damage (e.g., heat damage, chemical damage) that may otherwise occur to memory cells 104 during the formation of additional materials (e.g., the high-k dielectric material 108) over the memory cells 104. For example, the first dielectric liner material 106 may be configured (e.g., formulated, sized, shaped, positioned) to protect the memory cells 104 from a strong oxidizing environment that may be employed to form the high-k dielectric material 108, as described in further detail below. By way of non-limiting example, the first dielectric liner material 106 may be conformally formed over the memory cells 104.

The first dielectric liner material 106 may comprise a dielectric material compatible with the materials of the memory cells 104 and the high-k dielectric material 108. As used herein, the term "compatible" means and includes that a material that does not react with, break down, or absorb another material in an unintended way, and that also does not impair the chemical and/or mechanical properties of the another material in an unintended way. For example, the first dielectric liner material 106 may be formed of and include a dielectric nitride material, such as silicon nitride (SiN). As used herein, the term "silicon nitride" means and includes a chemical compound including silicon atoms and nitrogen atoms, and includes stoichiometric and non-stoichiometric compounds of silicon and nitrogen, as well as a gradient of nitrogen atoms in the silicon. In additional embodiments, the first dielectric liner material 106 may be formed of and include a different dielectric material, such as one or more of silicon oxynitride (SiON), silicon carbonitride (SiCN), and silicon carboxynitride (SiOCN). As used herein, the term "silicon oxynitride" means and includes a chemical compound including silicon atoms, nitrogen atoms, and oxygen atoms, and includes stoichiometric and non-stoichiometric compounds of silicon, nitrogen, and oxygen, as well as a gradient of nitrogen and oxygen atoms in the silicon. As used herein, the term "silicon carbonitride" means and includes a chemical compound including silicon atoms, carbon atoms, and nitrogen atoms, and includes stoichiometric and non-stoichiometric compounds of silicon, carbon, and nitrogen, as well as a gradient of nitrogen and carbon atoms in the silicon. As used herein, the term "silicon carboxynitride" means and includes a chemical compound including silicon atoms, carbon atoms, nitrogen atoms, and oxygen atoms, and includes stoichiometric and non-stoichiometric compounds of silicon, carbon, nitrogen, and oxygen, as well as a gradient of nitrogen, carbon, and oxygen atoms in the silicon.

The first dielectric liner material 106 may be formed at any thickness sufficient to protect the memory cells 104 from damage during processing following the formation of the first dielectric liner material 106, and facilitating desired dimensions and spacing of components of the memory structure 100. For example, as described in further detail below, an overall thickness of the first dielectric liner material 106 may be selected at least partially based on overall thicknesses of the high-k dielectric material 108 and the second dielectric liner material 110 to provide desired separation between adjacent memory cells 104 of the memory structure 100. A thickness of the first dielectric liner material 106 may, for example, be less than or equal to about 100 Angstroms (Å), such as within a range of from about 10 Å to about 100 Å, from about 25 Å to about 100 Å, from about 50 Å to about 100 Å, or from about 60 Å to about 80 Å. In some embodiments, a maximum thickness of the first dielectric liner material 106 is equal to about 66 Å. In additional embodiments, a maximum thickness of the first dielectric liner material 106 is equal to about 100 Å. The thickness of the first dielectric liner material 106 may be substantially uniform (e.g., non-variable, constant), or may be at least partially non-uniform (e.g., variable, non-constant). For example, portions of the first dielectric liner material 106 overlying upper surfaces and side surfaces of the memory cells 104 may exhibit substantially the same thicknesses, or portions of the first dielectric liner material 106 overlying upper surfaces of the memory cells 104 may exhibit one or more different thicknesses (e.g., a larger thickness, a smaller thickness) than portions of the first dielectric liner material 106 overlying one or more side surfaces (e.g., side surfaces of one or more of the first electrode structure 114, the select device structure 116, the second electrode structure 118 (if any), the storage element structure 120, and the third electrode structure 122) of the memory cells 104.

The first dielectric liner material 106 may be formed using conventional processes (e.g., conventional deposition processes, such as one or more of a CVD process, an ALD process, and a PVD process) and conventional processing equipment, which are not described in detail herein. By way of non-limiting example only, the first dielectric liner material 106 may be formed by a low temperature (e.g., less than or equal to about 250° C.) CVD process, such as a capacitively coupled PECVD process, an inductively coupled plasma chemical vapor deposition (ICPCVD) process, a pulsed CVD process, or a remote plasma CVD process. The low temperature process for forming the first dielectric liner material 106, if PECVD is employed, may be conducted with or without pulsing of the process power source. In some embodiments wherein the first dielectric liner material 106 comprises SiN, the first dielectric liner material 106 is formed by a pulsed PECVD process conducted at a temperature of less than about 250° C. The pulsed PECVD process may utilize conventional silicon reactant gases that do not contain carbon and conventional nitrogen reactant gases. For instance, the SiN may be formed using silane ($SiH_4$) and ammonia ($NH_3$) or silane and nitrogen gas ($N_2$) as the reactant gases. Other parameters of the pulsed PECVD process, such as flow rates, pressure, and RF power may be determined by a person of ordinary skill in the art and are not described in detail herein. The pulsed PECVD process may also be free of chlorinated reagents or plasma treatments to mitigate damage (e.g., heat damage, chemical damage) to other components (e.g., the memory cells 104, the conductive line structure 102) of the memory structure 100.

The high-k dielectric material 108 overlying the first dielectric liner material 106 may comprise a material having a dielectric constant greater than that of silicon dioxide ($SiO_2$). As used herein, the term "dielectric constant" refers to the property of a particular bulk material, rather than the effective dielectric constant of a material as it is practically employed, which may be affected by material thickness or other factors. The high-k dielectric material 108 may reduce current leakage from and enhance the electrical performance of the memory cells 104, and may be compatible with the materials of the first dielectric liner material 106 and the second dielectric liner material 110. By way of non-limiting example, the high-k dielectric material 108 may be formed of and include one or more of hafnium oxide ($HfO_2$), nitrided hafnium oxide (HfON), hafnium silicate oxide, aluminum-doped hafnium oxide (HfAlO), aluminum oxide ($Al_2O_3$), aluminum silicate oxide, zirconium oxide ($ZrO_2$), tantalum pentoxide ($Ta_2O_5$), lanthanum oxide ($La_2O_3$), titanium oxide ($TiO_2$), and yttrium oxide ($Y_2O_3$). In some embodiments, the high-k dielectric material 108 is formed of and includes $Al_2O_3$.

The high-k dielectric material 108 may have any thickness able to provide the memory cells 104 with low current leakage and enhanced electrical performance, and facilitating desired dimensions and spacing of components of the memory structure 100. An overall thickness of the high-k dielectric material 108 may be selected at least partially based on overall thicknesses of the first dielectric liner material 106 and the second dielectric liner material 110 to provide desired separation between adjacent memory cells 104 of the memory structure 100. A thickness of the high-k dielectric material 108 may, for example, be less than or equal to about 25 Å, such as within a range of from about 10 Å to about 25 Å, from about 15 Å to about 25 Å, from about 20 Å to about 25 Å. In some embodiments, a maximum thickness of the first dielectric liner material 106 is equal to about 25 Å. In additional embodiments, a maximum thickness of the high-k dielectric material 108 is equal to about 25 Å. The thickness of the high-k dielectric material 108 may be substantially uniform (e.g., non-variable, constant), or may be at least partially non-uniform (e.g., variable, non-constant). For example, portions of the high-k dielectric material 108 overlying upper surfaces and side surfaces of the memory cells 104 may exhibit substantially the same thickness, or portions of the first dielectric liner material 106 overlying one or more upper surfaces of the memory cells 104 may exhibit one or more different thicknesses (e.g., a larger thickness, a smaller thickness) than portions of the first dielectric liner material 106 overlying one or more side surfaces (e.g., side surfaces of one or more of the first electrode structure 114, the select device structure 116, the second electrode structure 118 (if any), the storage element structure 120, and the third electrode structure 122) of the memory cells 104.

The high-k dielectric material 108 may be formed using conventional processes (e.g., conventional deposition processes, such as one or more of a CVD process, a PECVD process, an ALD process, and a PVD process) and conventional processing equipment, which are not described in detail herein. By way of non-limiting example, if the high-k dielectric material 108 is formed of and includes $Al_2O_3$, the $Al_2O_3$ may be formed by a low temperature ALD process by pulsing aluminum precursors and oxygen containing precursors sequentially.

With continued reference to FIG. 1A, the second dielectric liner material 110 is formed on or over the high-k dielectric material 108. The second dielectric liner material 110 may adhere directly to the high-k dielectric material 108, and may facilitate the subsequent formation of one or more additional dielectric materials over the high-k dielectric material 108 without the formation of undesirable defects in the additional dielectric materials and/or the high-k dielectric material 108, as described in further detail below. For example, the second dielectric liner material 110 may be configured (e.g., formulated, sized, shaped, positioned) to circumvent negative effects on (e.g., impediments to) the polymerization of precursors employed to form the additional dielectric materials that may otherwise result from interactions (e.g., reactions) between the high-k dielectric material 108 and the precursors.

The second dielectric liner material 110 may comprise a dielectric material compatible with the material compositions of the high-k dielectric material 108 and one or more materials (e.g., additional dielectric materials) to subsequently be formed on or over the second dielectric liner material 110. For example, the second dielectric liner material 110 may be formed of and include a dielectric nitride material, such as SiN. In additional embodiments, the first dielectric liner material 106 may be formed of and include a different dielectric material, such as one or more of SiON, SiCN, and SiOCN.

The material composition of the second dielectric liner material 110 may be substantially the same as or may be different than the material composition of the first dielectric liner material 106. In some embodiments, the material composition of the second dielectric liner material 110 is substantially the same as the material composition of the first dielectric liner material 106. As a non-limiting example, the first dielectric liner material 106 and the second dielectric liner material 110 may be each formed of and include substantially the same formulation of SiN (e.g., substantially the same chemical compound including silicon atoms and nitrogen atoms, such as substantially the same stoichiometric compound of silicon and nitrogen, or substantially the same non-stoichiometric compound of silicon and nitrogen). As another non-limiting example, the first dielectric liner material 106 and the second dielectric liner material 110 may be each formed of and include substantially the same formulation of one or more of SiON, SiCN, and SiOCN. In additional embodiments, the material composition of the second dielectric liner material 110 is different than the material composition of the first dielectric liner material 106. As a non-limiting example, the first dielectric liner material 106 may be formed of and include one or more of SiN, SiON, SiCN, and SiOCN, and the second dielectric liner material 110 may be formed of and include one or more other of SiN, SiON, SiCN, and SiOCN. As another non-limiting example, the first dielectric liner material 106 may be formed of and include a first formulation of SiN, and the second dielectric liner material 110 may be formed of and include a second, different formulation of SiN (e.g., a chemical compound including a different ratio of silicon atoms and nitrogen atoms). As a further non-limiting example, the first dielectric liner material 106 may be formed of and include a first formulation of one or more of SiON, SiCN, and SiOCN, and the second dielectric liner material 110 may be formed of and include a second, different formulation of one or more of SiON, SiCN, and SiOCN (e.g., the first dielectric liner material 106 and the second dielectric liner material 110 may each be formed of SiON, but the second dielectric liner material 110 may comprise different amounts and/or distributions of silicon atoms, nitrogen atoms, and oxygen atoms than the first dielectric liner material 106; the first dielectric liner material 106 and the second dielectric liner material 110 may each be formed of SiCN, but the second dielectric liner material 110 may comprise different amounts and/or distributions of silicon atoms, nitrogen atoms, and/or carbon atoms than the first dielectric liner material 106; the first dielectric liner material 106 and the second dielectric liner material 110 may each be formed of SiOCN, but the second dielectric liner material 110 may comprise different amounts and/or distributions of silicon atoms, nitrogen atoms, oxygen atoms, and/or carbon atoms than the first dielectric liner material 106).

The second dielectric liner material 110 may have any thickness facilitating the subsequent formation of one or more additional materials (e.g., additional dielectric materials) thereon or thereover, and facilitating desired dimensions and spacing of components of the memory structure 100. For example, an overall thickness of the second dielectric liner material 110 may be selected to substantially circumvent adverse interactions (e.g., adverse reactions, such as reactions impeding or preventing desired polymerization reactions) between the high-k dielectric material 108 thereunder and one or more materials (e.g., precursor materials) to be provided (e.g., deposited) thereover to form the additional materials. In addition, the overall thickness of the second dielectric liner material 110 may be selected at least partially based on overall thicknesses of the high-k dielectric material 108 and the first dielectric liner material 106 to provide desired separation between adjacent memory cells 104 of the memory structure 100. A thickness of the second dielectric liner material 110 may, for example, be less than or equal to about 100 Å, such as within a range of from about 10 Å to about 100 Å, from about 25 Å to about 100 Å, from about 50 Å to about 100 Å, or from about 60 Å to about 80 Å. In some embodiments, a maximum thickness of the second dielectric liner material 110 is equal to about 100 Å. In additional embodiments, a maximum thickness of the second dielectric liner material 110 is equal to about 66 Å. The thickness of the second dielectric liner material 110 may be substantially uniform (e.g., non-variable, constant), or may be at least partially non-uniform (e.g., variable, non-constant). For example, portions of the second dielectric liner material 110 overlying upper surfaces and side surfaces of the memory cells 104 may exhibit substantially the same thicknesses, or portions of the second dielectric liner material 110 overlying upper surfaces of the memory cells 104 may exhibit one or more different thicknesses (e.g., a larger thickness, a smaller thickness) than portions of the second dielectric liner material 110 overlying one or more side surfaces of the memory cells 104.

The thickness (or thicknesses) of the second dielectric liner material 110 may be substantially the same as or may be different than (e.g., greater than, less than) the thickness (or thicknesses) of the first dielectric liner material 106. In some embodiments, the second dielectric liner material 110 and the first dielectric liner material 106 exhibit substantially the same thickness (or thicknesses) as one another. For example, the second dielectric liner material 110 and the first dielectric liner material 106 may each exhibit a maximum thickness of about 83 Å. In additional embodiments, the thickness (or thicknesses) of the second dielectric liner material 110 is less than the thickness (or thicknesses) of the first dielectric liner material 106. For example, the first dielectric liner material 106 may exhibit a maximum thickness of about 100 Å and the second dielectric liner material 110 may exhibit a maximum thickness of about 66 Å. In further embodiments, the thickness (or thicknesses) of the second dielectric liner material 110 is greater than the thickness (or thicknesses) of the first dielectric liner material 106. For example, the first dielectric liner material 106 may exhibit a maximum thickness of about 66 Å and the second dielectric liner material 110 may exhibit a maximum thickness of about 100 Å. In addition, the second dielectric liner material 110 and the first dielectric liner material 106 may exhibit substantially the same thickness variability (or uniformity) as one another, or the second dielectric liner material 110 and the first dielectric liner material 106 may exhibit different thickness variabilities than one another. As a non-limiting example, the thicknesses of the first dielectric liner material 106 and the second dielectric liner material 110 may each be substantially uniform (e.g., non-variable, constant). As another non-limiting example, the first dielectric liner material 106 and the second dielectric liner material 110 may exhibit substantially the same variable (e.g., non-uniform, non-constant) thicknesses as one another. As a further non-limiting example, the first dielectric liner material 106 and the second dielectric liner material 110 may each different variable (e.g., non-uniform, non-constant) thicknesses than one another. As a yet further non-limiting example, one of the first dielectric liner material 106 and the second dielectric liner material 110 may exhibit a substantially uniform thickness, and the other of the first dielectric liner material 106 and the second dielectric liner material 110 may exhibit a variable thickness.

The second dielectric liner material 110 may be using conventional processes (e.g., conventional deposition processes, such as one or more of a CVD process, a PECVD process, an ALD process, and a PVD process) and conventional processing equipment, which are not described in detail herein. By way of non-limiting example only, the second dielectric liner material 110 may be formed by a low temperature (e.g., less than or equal to about 250° C.), a CVD process, such as a capacitively coupled PECVD process, an ICPCVD process, a pulsed CVD process, or a remote plasma CVD process. The low temperature process for forming the second dielectric liner material 110, if PECVD is employed, may be conducted with or without pulsing of the process power source. In some embodiments wherein the second dielectric liner material 110 comprises SiN, the second dielectric liner material 110 is formed by a pulsed PECVD process conducted at a temperature of less than about 250° C. The pulsed PECVD process may utilize conventional silicon reactant gases that do not contain carbon and conventional nitrogen reactant gases. For instance, the SiN may be formed using silane ($SiH_4$) and ammonia ($NH_3$) or silane and nitrogen gas ($N_2$) as the reactant gases. Other parameters of the pulsed PECVD process, such as flow rates, pressure, and RF power may be determined by a person of ordinary skill in the art and are not described in detail herein. The pulsed PECVD process may also be free of chlorinated reagents or plasma treatments to mitigate damage (e.g., heat damage, chemical damage) to other components (e.g., the memory cells 104, the first dielectric liner material 106, the high-k dielectric material 108, the conductive line structure 102) of the memory structure 100. The processes employed to form the second dielectric liner material 110 may be substantially the same as or may be different than the processes employed to form the first dielectric liner material 106.

The oxide material 124, if any, may be formed on or over the second dielectric liner material 110. If present, the oxide material 124 may provide enhanced adhesion strength between the second dielectric liner material 110 and one or more additional materials (e.g., additional dielectric materials) to be formed thereover relative to forming the one or more additional dielectric materials directly on the second dielectric liner material 110, thereby reducing a risk of delamination.

The oxide material 124, if any, may comprise an oxide material compatible with the material compositions of the second dielectric liner material 110 and one or more materials (e.g., additional dielectric materials) to subsequently be formed over the oxide material 124. For example, the oxide material 124 may be formed of and include a dielectric oxide material, such as a silicon oxide material (e.g., $SiO_2$, phosphosilicate glass, borosilicate glass, borophosphosilicate glass, or combinations thereof). In some embodiments, the oxide material 124 comprises $SiO_2$. In additional embodiments, the oxide material 124 comprises one or more of phosphosilicate glass, borosilicate glass, and borophosphosilicate glass. In further embodiments, the oxide material 124 is absent (e.g., omitted) from the memory structure 100.

The oxide material 124, if present, may have any thickness facilitating the subsequent formation of one or more additional materials (e.g., additional dielectric materials) thereon or thereover, and facilitating desired dimensions and spacing of components of the memory structure 100. For example, an overall thickness of the oxide material 124 may be selected at least partially based on overall thicknesses of the first dielectric liner material 106, the high-k dielectric material 108, and the second dielectric liner material 110 to provide desired separation between adjacent memory cells 104 of the memory structure 100. A thickness of the oxide material 124 may, for example, be less than or equal to about 10 Å, such as less than or equal to about 5 Å, or less than or equal to about 2 Å. In some embodiments, the oxide material 124 comprises a single (e.g., only one) atomic layer (e.g., a monolayer) of dielectric oxide material (e.g., silicon oxide material) on the second dielectric liner material 110. The thickness of the oxide material 124 (if any) may be substantially uniform (e.g., non-variable, constant), or may be at least partially non-uniform (e.g., variable, non-constant). In some embodiments, the thickness of the oxide material 124 is substantially uniform.

The oxide material 124, if present, may be formed using conventional processes (e.g., conventional deposition processes, such as one or more of a CVD process, a PECVD process, an ALD process, and a PVD process) and conventional processing equipment, which are not described in detail herein. In some embodiments, the oxide material 124 is formed using an ALD process. By way of non-limiting example, if the oxide material 124 is formed of and includes $SiO_2$, the $SiO_2$ may be formed by a low temperature ALD process by pulsing silicon precursors and oxygen containing precursors sequentially.

Referring next to FIG. 1B, at least one additional dielectric material 126 may be formed on or over the second dielectric liner material 110 (e.g., on the oxide material 124, if present; on the second dielectric liner material 110 if the oxide material 124 is absent). As shown in FIG. 1B, the additional dielectric material 126 laterally intervenes between adjacent memory cells 104 of the memory structure 100, and may substantially completely fill remaining spaces (e.g., spaces unoccupied by the first dielectric liner material 106, the high-k dielectric material 108, the second dielectric liner material 110, and the oxide material 124 (if any)) between the adjacent memory cells 104. The additional dielectric material 126 may electrically isolate adjacent memory cells 104 of the memory structure 100 from one another. The additional dielectric material 126 may also longitudinally overlie the memory cells 104 of the memory structure 100. An upper surface of the additional dielectric material 126 may be substantially planar, and may be positioned longitudinally above upper surfaces of the memory cells 104.

The additional dielectric material 126 may comprise a dielectric material compatible with the material composition of the second dielectric liner material 110 (and the oxide material 124, if present). For example, the additional dielectric material 126 may be formed of and include a carbonated dielectric oxide material. In some embodiments, the additional dielectric material 126 is a carbonated silicon oxide (SiOC). As used herein, the term "carbonated silicon oxide" means and includes a chemical compound including silicon atoms, carbon atoms, and oxygen atoms, and includes stoichiometric and non-stoichiometric compounds of silicon, carbon, and oxygen, as well as a gradient of oxygen and carbon atoms in the silicon. The carbonated dielectric oxide material (e.g., carbonated silicon oxide) may include any suitable amount of carbon atoms. By way of non-limiting example, the carbonated dielectric oxide material may comprise from about five (5) atomic percent (atomic %) carbon to about sixty (60) atomic % carbon, such as from about ten (10) atomic % carbon to about fifty-five atomic % carbon, or from about fifteen (15) atomic % carbon to about fifty (50) atomic % carbon. In some embodiments, the carbonated dielectric oxide material comprises about fifty (50) atomic % carbon. In additional embodiments, the carbonated dielectric oxide material comprises about fifteen (15) atomic % carbon.

As previously discussed, covering (e.g., surrounding, encapsulating) the high-k dielectric material 108 with the second dielectric liner material 110 prior to the formation of the additional dielectric material 126 over the high-k dielectric material 108 may prevent adverse interactions (e.g., adverse reactions) between the high-k dielectric material 108 and one or more of the additional dielectric material 126 and precursors to the additional dielectric material 126 that may otherwise impact desirable properties of the additional dielectric material 126 and/or the high-k dielectric material 108. For example, covering the high-k dielectric material 108 with the second dielectric liner material 110 may prevent changes (e.g., physical changes, chemical changes) to the additional dielectric material 126 resulting from interactions between the high-k dielectric material 108 and the additional dielectric material 126 that may undesirably soften the additional dielectric material 126. Such a softened additional dielectric material 126 may be more susceptible to to damage (e.g., gouging) and/or defects (e.g., embedded particles, such as embedded chemical-mechanical planarization slurry particles) during subsequent processing of the memory structure 100.

The additional dielectric material 126 may be formed using conventional processes (e.g., conventional deposition processes, such as one or more of spin-on coating, blanket coating, in situ growth, CVD, ALD, and PVD; conventional densification processes) and conventional processing equipment, which are not described in detail herein. In some embodiments, the additional dielectric material 126 is formed over the second dielectric liner material 110 through a spin-on coating process.

Referring next to FIG. 1C, following the formation of the additional dielectric material 126, the memory structure 100 may be subjected to at least one material removal process to remove a portion of the additional dielectric material 126. For example, the memory structure 100 may be subjected to at least one chemical-mechanical planarization (CMP) process to reduce a height of the additional dielectric material 126, and form a planar surface 128 for the memory structure 100. The CMP process may include polishing at least the additional dielectric material 126 using at least one CMP slurry and at least one polishing pad. The CMP slurry may, for example, include abrasive particles, at least one solvent (e.g., water), and at least one chemically reactive material formulated to remove the additional dielectric material 126. Covering (e.g., surrounding, encapsulating) the high-k dielectric material 108 with the second dielectric liner material 110 may enhance CMP processing efficiency (e.g., may enhance one or more of material removal rates, material removal detectability, and CMP polishing pad longevity), may improve removal profile consistency (e.g., may enhance material removal uniformity across lateral dimensions of the memory structure 100), and may maintain the integrity of the high-k dielectric material 108 (e.g., may protect the high-k dielectric material 108 from adverse interactions with the solvent of the CMP slurry).

As shown in FIG. 1C, the planar surface 128 of the memory structure 100 may be defined by upper surfaces of remaining portions of the additional dielectric material 126, and upper surfaces of the second dielectric liner material 110 substantially coplanar with the upper surfaces of the remaining portions of the additional dielectric material 126. The second dielectric liner material 110 may protect the high-k dielectric material 108 from removal during the material removal process (e.g. CMP process). In additional embodiments, the planar surface 128 of the memory structure 100 may only be defined by an upper surface of the additional dielectric material 126. Upper surfaces of the second dielectric liner material 110 may, for example, be completely covered by remaining portions of the additional dielectric material 126 following the material removal process. In further embodiments, the planar surface 128 of the memory structure 100 may be defined by upper surfaces of remaining portions of the additional dielectric material 126, and upper surfaces of one or more components of the memory structure 100 other than the second dielectric liner material 110. For example, the planar surface 128 of the memory structure 100 may be defined by the upper surfaces of remaining portions of the additional dielectric material 126 and upper surfaces of the high-k dielectric material 108, or may be defined by the upper surfaces of remaining portions of the additional dielectric material 126 and upper surfaces of the oxide material 124.

Therefore, in accordance with embodiments of the disclosure, a method of forming a memory structure comprises forming a first dielectric liner material over memory cells. A high-k dielectric material is formed over the first dielectric liner material. A second dielectric liner material is formed over the high-k dielectric material. An additional dielectric material is formed over the second dielectric liner material.

Following the removal of a portion of the additional dielectric material 126, the memory structure 100 may be subjected to additional processing (e.g., additional material removal processes, additional material deposition processes). By way of non-limiting example, the memory structure 100 may be subjected to at least one additional material removal process to at least partially expose (e.g., uncover) upper surfaces of the third electrode structures 122 of the memory cells 104, and one or more materials (e.g., one or more conductive materials) may be formed on or over the exposed portions of the upper surfaces of the third electrode structures 122. Side surfaces of the memory cells 104 (e.g., side surfaces of the first electrode structure 114, the select device structure 116, the second electrode structure 118, the storage element structure 120, and the third electrode structure 122) may remain substantially covered (e.g., surrounded, encapsulated) by one or more (e.g., each) of the first dielectric liner material 106, the high-k dielectric material 108, the second dielectric liner material 110, the oxide material 124 (if any), and the additional dielectric material 126. For example, side surfaces of the memory cells 104 may remain substantially covered by the first dielectric liner material 106, side surfaces of the first dielectric liner material 106 may remain substantially covered by the high-k dielectric material 108, side surfaces of the high-k dielectric material 108 may remain substantially covered by the second dielectric liner material 110, and side surfaces of the second dielectric liner material 110 may remain substantially covered by the additional dielectric material 126.

Thus, in accordance with embodiments of the disclosure, a semiconductor device comprises memory cells, a first dielectric liner material overlying the memory cells, a high-k dielectric material overlying the first dielectric liner material, a second dielectric liner material overlying the high-k dielectric material, and an additional dielectric material overlying the second dielectric liner material.

Figure 2:
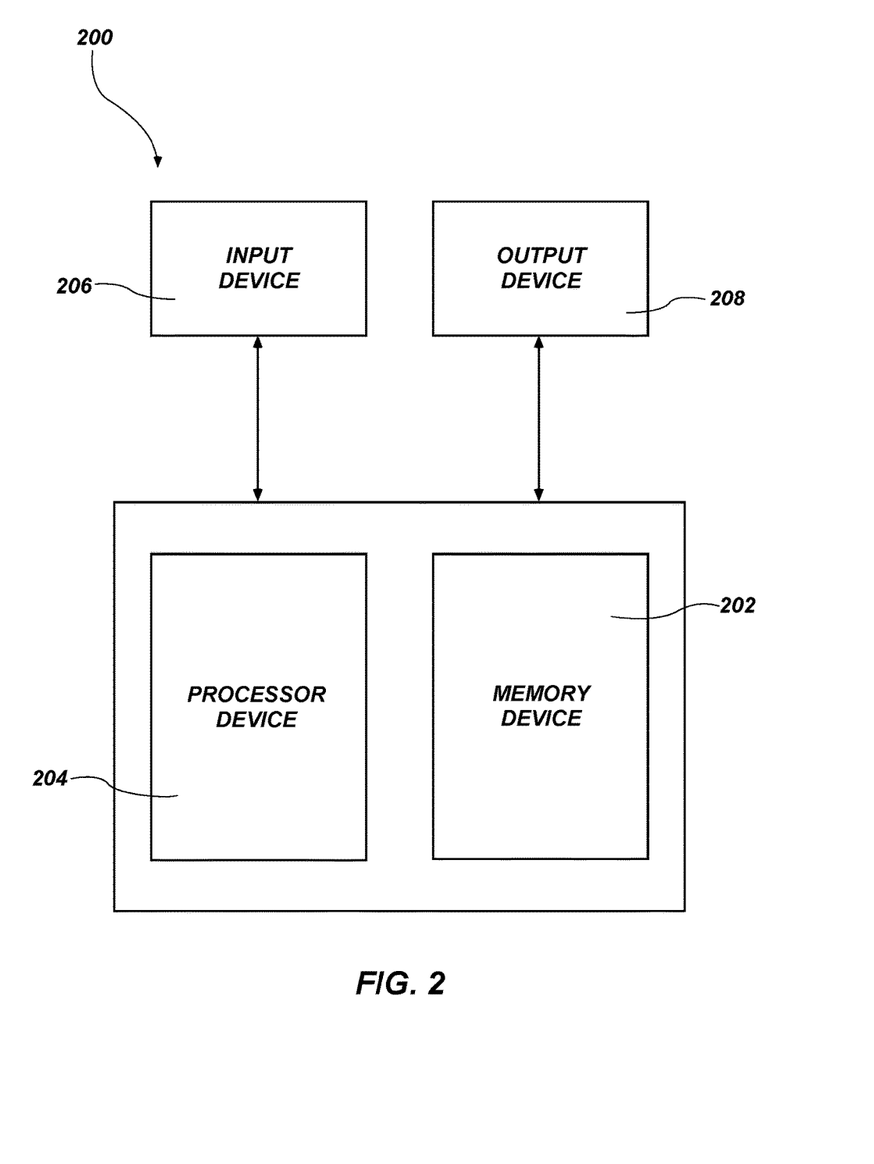
FIG. 2 is a schematic block diagram illustrating an electronic system in accordance with embodiments of the disclosure.

The memory structure 100 may be used in a wide variety of semiconductor devices including, but not limited to memory devices (e.g., resistive memory devices, such as RRAM devices). Semiconductor devices that include the memory structure 100 in accordance with embodiments of the disclosure may be included in a variety of electronic systems. For example, FIG. 2 is a block diagram of an electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, etc. The electronic system 200 includes at least one semiconductor device 202 (e.g., at least one memory device). The electronic system 200 may further include at least one electronic signal processor device 204 (often referred to as a "microprocessor"). One or more of the semiconductor device 202 and the electronic signal processor device 204 may include, for example, an embodiment of the memory structure 100 previously described with respect to FIGS. 1A-1C. The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touch screen device that can be used both to input information to the electronic system 200 and to output visual information to a user. The one or more input devices 206 and output devices 208 may communicate electrically with at least one of the semiconductor device 202 and the electronic signal processor device 204.

Thus, in accordance with embodiments of the disclosure, an electronic system comprises a memory device in communication with at least one of an electronic signal processor device, an input device, and an output device. The memory device includes a memory structure comprising memory cells, a first dielectric nitride material on side surfaces of the memory cells, a high-k dielectric material on side surfaces of the first dielectric nitride material, a second dielectric nitride material on side surfaces of the high-k dielectric material, and an additional dielectric material over side surfaces of the second dielectric nitride material.

While the disclosure is susceptible to various modifications and alternative forms, specific embodiments have been shown by way of example in the drawings and have been described in detail herein. However, the disclosure is not intended to be limited to the particular forms disclosed. Rather, the disclosure encompasses all modifications, equivalents, and alternatives falling within the scope of the following appended claims and their legal equivalents.

What is claimed is:

1. A semiconductor device, comprising:
memory cells, at least one of the memory cells comprising:
a first electrode structure;
a select device structure over the first electrode structure;
a storage element structure over the select device structure; and
a second electrode structure over the storage element structure;
a first dielectric liner material overlying side surfaces of the memory cells;
a high-k dielectric material overlying side surfaces of the first dielectric liner material;
a second dielectric liner material overlying side surfaces of the high-k dielectric material; and
an additional dielectric material overlying side surfaces of the second dielectric liner material.

2. The semiconductor device of claim 1, further comprising a third electrode structure between the select device structure and the storage element structure.

3. The semiconductor device of claim 1, wherein the first dielectric liner material exhibits a thickness less than or equal to about 100 Å and comprises one or more of silicon nitride, silicon oxynitride, silicon carbonitride, and silicon carboxynitride.

4. The semiconductor device of claim 1, wherein the high-k dielectric material exhibits a thickness less than or equal to about 25 Å and comprises one or more of aluminum oxide, hafnium oxide, nitrided hafnium oxide, hafnium silicate oxide, aluminum-doped hafnium oxide, aluminum silicate oxide, zirconium oxide, tantalum pentoxide, lanthanum oxide, titanium oxide, and yttrium oxide.

5. The semiconductor device of claim 1, wherein the second dielectric liner material exhibits a thickness less than or equal to about 100 Å and comprises one or more of silicon nitride, silicon oxynitride, silicon carbonitride, and silicon carboxynitride.

6. The semiconductor device of claim 1, wherein the second dielectric liner material comprises substantially the same material composition as the first dielectric liner material.

7. The semiconductor device of claim 1, wherein the second dielectric liner material comprises substantially the same thickness as the first dielectric liner material.

8. The semiconductor device of claim 1, wherein the second dielectric liner material exhibits a different thickness than the first dielectric liner material.

9. The semiconductor device of claim 1, wherein:
the first dielectric liner material comprises silicon nitride;
the high-k dielectric material comprises aluminum oxide; and
the second dielectric liner material comprises silicon nitride.

10. The semiconductor device of claim 1, further comprising a dielectric oxide material between the second dielectric liner material and the additional dielectric material.

11. The semiconductor device of claim 1, wherein the additional dielectric material comprises one or more of a carbonated dielectric oxide material and a boronated dielectric oxide material.

12. The semiconductor device of claim 1, comprising a memory die.

13. An electronic system, comprising:
a memory device in communication with at least one of an electronic signal processor device, an input device, and an output device, the memory device including a memory structure comprising:
memory cells, at least one of the memory cells comprising:
a first electrode structure;
a select device structure over the first electrode structure;
a storage element structure over the select device structure; and
a second electrode structure over the storage element structure;
a first dielectric nitride material on side surfaces of the memory cells;
a high-k dielectric material on side surfaces of the first dielectric nitride material;
a second dielectric nitride material on side surfaces of the high-k dielectric material; and
an additional dielectric material over side surfaces of the second dielectric nitride material.

* * * * *

UNITED STATES PATENT AND TRADEMARK OFFICE
CERTIFICATE OF CORRECTION

| | | |
|---|---|---|
| PATENT NO. | : 10,147,875 B1 | Page 1 of 1 |
| APPLICATION NO. | : 15/692599 | |
| DATED | : December 4, 2018 | |
| INVENTOR(S) | : Andrew J. Hansen et al. | |

It is certified that error appears in the above-identified patent and that said Letters Patent is hereby corrected as shown below:

On the Title Page

In ITEM (57) ABSTRACT, Line 1:   change "device comprises includes" to --device includes--

Signed and Sealed this
Twenty-ninth Day of January, 2019

Andrei Iancu
*Director of the United States Patent and Trademark Office*